United States Patent
Obata et al.

(10) Patent No.: US 9,263,909 B2
(45) Date of Patent: Feb. 16, 2016

(54) CONTROL DEVICE AND CONTROL METHOD FOR NONAQUEOUS SECONDARY BATTERY

(75) Inventors: Hiroyuki Obata, Nagoya (JP); Makoto Nakashima, Toyota (JP); Hiroki Omae, Nagoya (JP)

(73) Assignee: TOYOTA JIDOSHA KABUSHIKI KAISHA, Toyota-Shi (JP)

( * ) Notice: Subject to any disclaimer, the term of this patent is extended or adjusted under 35 U.S.C. 154(b) by 152 days.

(21) Appl. No.: 14/347,396

(22) PCT Filed: Sep. 28, 2011

(86) PCT No.: PCT/JP2011/005463
§ 371 (c)(1),
(2), (4) Date: Mar. 26, 2014

(87) PCT Pub. No.: WO2013/046263
PCT Pub. Date: Apr. 4, 2013

(65) Prior Publication Data
US 2014/0225571 A1    Aug. 14, 2014

(51) Int. Cl.
*H02J 7/00* (2006.01)
*H01M 10/44* (2006.01)
*H01M 10/48* (2006.01)
*G01R 31/36* (2006.01)

(52) U.S. Cl.
CPC ............. *H02J 7/007* (2013.01); *H01M 10/44* (2013.01); *H01M 10/48* (2013.01); *H01M 10/484* (2013.01); *G01R 31/3679* (2013.01); *H01M 2220/20* (2013.01)

(58) Field of Classification Search
CPC .................................................... H02J 7/0031
USPC ........................................................ 320/136
See application file for complete search history.

(56) References Cited

U.S. PATENT DOCUMENTS

| 7,656,125 | B2 * | 2/2010 | Lampe-Onnerud | .......... H01M 10/0525 320/133 |
| 2006/0202857 | A1 | 9/2006 | Kawahara et al. | |
| 2007/0108946 | A1 * | 5/2007 | Yamauchi | ............. H01M 10/42 320/132 |
| 2010/0241376 | A1 | 9/2010 | Kikuchi et al. | |
| 2013/0293200 | A1 | 11/2013 | Obata et al. | |
| 2014/0184165 | A1 * | 7/2014 | Takahashi | .......... H01M 10/486 320/134 |

FOREIGN PATENT DOCUMENTS

| JP | 2009-123435 A | 6/2009 |
| JP | 5321757 B2 | 10/2013 |
| KR | 10-2006-0097581 A | 9/2006 |

* cited by examiner

*Primary Examiner* — Suresh Memula
(74) *Attorney, Agent, or Firm* — Kenyon & Kenyon LLP

(57) ABSTRACT

A control device that controls discharge of a nonaqueous secondary battery in order that discharge electric power of the nonaqueous secondary battery does not exceed an upper limit value includes a current sensor and a controller. The controller calculates an evaluation value for evaluating a first deterioration component based on a discharge state detected by using the current sensor. The first deterioration component is a component that reduces output performance of the nonaqueous secondary battery due to an imbalance of ion concentrations in an electrolytic solution caused by discharging the nonaqueous secondary battery. The controller integrates a value obtained by subtracting a correction coefficient from a first integrated value obtained by integrating the evaluation values in past, which exceed a target value, and the evaluation value at present, which exceeds the target value, to calculate a second integrated value. When the second integrated value exceeds a threshold value, the controller reduces the upper limit value.

12 Claims, 10 Drawing Sheets

CONTROL DEVICE AND CONTROL METHOD FOR NONAQUEOUS SECONDARY BATTERY

CROSS-REFERENCE TO RELATED APPLICATIONS

This is a national phase application based on the PCT International Patent Application No. PCT/JP2011/005463 filed on Sep. 28, 2011, the entire contents of which are incorporated herein by reference.

TECHNICAL FIELD

The present invention relates to a control device and a control method that control discharge of a nonaqueous secondary battery by evaluating the deterioration state of the nonaqueous secondary battery.

BACKGROUND ART

In the technique described in Patent Document 1, an evaluation value for evaluating deterioration of a battery due to high-rate discharge is calculated based on the records of a current value when the battery is charged/discharged. When the evaluation value does not exceed a target value, an upper limit value for allowing discharge of the battery is set to a maximum value. In contrast, when the evaluation value exceeds the target value, the upper limit value is set to a value smaller than the maximum value.

According to Patent Document 1, when the evaluation value does not exceed the target value, the upper limit value is set to the maximum value, so as to produce vehicle dynamic performance as required by a driver. Further, when the evaluation value exceeds the target value, the upper limit value is set to a value smaller than the maximum value, so as to suppress the occurrence of deterioration due to high-rate discharge.

PRIOR ART DOCUMENT

Patent Document

Japanese Patent Application Publication No. 2009-123435 (JP 2009-123435 A) (FIGS. 4, 7, and the like)

SUMMARY OF THE INVENTION

Problems to be Solved by the Invention

In the technique described in Patent Document 1, the upper limit value for allowing discharge of the battery is changed only according to the magnitude relationship between the evaluation value and the target value, which can sometimes excessively restrict discharge of the battery. When discharge of the battery is excessively restricted, it is difficult to ensure sufficient output performance of the battery.

Means for Solving the Problems

The first invention of the present application is a control device that controls discharge of a nonaqueous secondary battery in order that discharge electric power of the nonaqueous secondary battery does not exceed an upper limit value, and includes a current sensor and a controller. The current sensor detects a current value at the time of charging/discharging the nonaqueous secondary battery. The controller calculates an evaluation value for evaluating a first deterioration component based on a discharge state detected by using the current sensor. The first deterioration component is a component that reduces output performance of the nonaqueous secondary battery due to an imbalance of ion concentrations in an electrolytic solution caused by discharging the nonaqueous secondary battery.

The controller integrates a value obtained by reducing a first integrated value with a correction coefficient, and the evaluation value at present, which exceeds a target value, the first integrated value obtained by integrating the evaluation values in past, which exceed the target value, to calculate a second integrated value. The controller determines whether or not the second integrated value exceeds a threshold value, and reduces the upper limit value when the second integrated value exceeds the threshold value. Discharge of the nonaqueous secondary battery can be restricted by reducing the upper limit value.

According to the first invention of the present application, when the second integrated value to be compared with the threshold value is calculated, the correction coefficient is used to decrease the first integrated value. Because the first deterioration component is lessened by resting charge/discharge of the nonaqueous secondary battery or by other methods, the first integrated value obtained from the evaluation values in past can be decreased. Therefore, the second integrated value can be calculated taking into account lessening of the first deterioration component, and can be prevented from unnecessarily exceeding the threshold value. That is, discharge of the nonaqueous secondary battery can be prevented from being excessively restricted, and a required output of the nonaqueous secondary battery can be ensured.

The correction coefficient can be a value larger than 0 and smaller than 1. The second integrated value can be calculated by integrating a value obtained by multiplying the first integrated value by the correction coefficient, and the evaluation value at present, which exceeds the target value.

The second integrated value can be calculated by only using the evaluation values obtained in the last predetermined period. Because the first deterioration component is lessened by resting charge/discharge of the nonaqueous secondary battery or by other methods, the evaluation values in past hardly affect evaluation of the first deterioration component. Thus, the evaluation values obtained in the latest predetermined period are only used, and therefore the second integrated value can be calculated taking into account lessening of the first deterioration component.

Meanwhile, a time average value can be calculated by dividing the second integrated value calculated for the latest predetermined period by the predetermined period. Whether or not the time average value exceeds the threshold value is then determined, and when the time average value exceeds the threshold value, the upper limit value can be reduced. Calculating the time average value can prevent the second integrated value from temporarily increasing and exceeding the threshold value. Using the time average value can eliminate the case where the second integrated value temporarily exceeds the threshold value, and can prevent discharge of the nonaqueous secondary battery from being excessively restricted.

At the time of calculating the first integrated value and the second integrated value, when the evaluation value is larger than the target value that is positive, the difference between the positive target value and the evaluation value can be added. When the evaluation value is smaller than the target value that is negative, the difference between the negative target value and the evaluation value can be subtracted.

The threshold value can be changed in order that as a second deterioration component is larger, the amount of increasing the second integrated value until the second integrated value reaches the threshold value is smaller. The second deterioration component represents deterioration of a constituent material that contributes to charge/discharge of the nonaqueous secondary battery. In contrast, the threshold value can be changed in order that as the second deterioration component is smaller, the amount of increasing the second integrated value until the second integrated value reaches the threshold value is larger.

As the second deterioration component is larger, the first deterioration component is smaller. Therefore, when the second deterioration component is estimated, how much deterioration by the first deterioration component is allowable can be identified. As deterioration by the first deterioration component is more allowable, the amount of increasing the second integrated value until the second integrated value reaches the threshold value can be larger.

When the threshold value is changed, a map for identifying the threshold value can be prepared according to the second deterioration component. Information that shows a corresponding relationship between the map and the second deterioration component can be stored in the memory. The second deterioration component can be estimated by using the temperature and energization amount of the nonaqueous secondary battery. The threshold value can be identified by using the map that corresponds to the estimated second deterioration component among a plurality of the maps.

As the map for identifying the threshold value, a map that shows a relationship between the threshold value, the temperature of the nonaqueous secondary battery when its charge/discharge is performed, and the usage state of the nonaqueous secondary battery can be used. When a vehicle runs using the output of the nonaqueous secondary battery, the charged/discharged amount of the nonaqueous secondary battery relative to the vehicle running distance (Ah/km) can be used as the usage state of the nonaqueous secondary battery.

The temperature used for estimating the second deterioration component includes the temperature of the nonaqueous secondary battery when its charge/discharge is performed, and the temperature of the nonaqueous secondary battery when its charge/discharge is not performed. By using the temperature of the secondary battery when its charge/discharge is not performed, a part of the second deterioration component can be estimated. Further, by using the temperature and energization amount of the secondary battery when its charge/discharge is performed, the remaining part of the second deterioration component can be estimated.

The second invention of the present application is a control method of controlling discharge of a nonaqueous secondary battery in order that discharge electric power of the nonaqueous secondary battery does not exceed an upper limit value, and detects a current value at the time of charging/discharging the nonaqueous secondary battery by using a current sensor, and calculates an evaluation value for evaluating a first deterioration component based on a discharge state detected by using the current sensor. The first deterioration component reduces output performance of the nonaqueous secondary battery due to an imbalance of ion concentrations in an electrolytic solution caused by discharging the nonaqueous secondary battery.

Further, a value, obtained by reducing a first integrated value with a correction coefficient, and the evaluation value at present, which exceeds a target value, the first integrated value obtained by integrating the evaluation values in past, which exceed the target value, are integrated to calculate a second integrated value, and whether or not the second integrated value exceeds a threshold value is determined. When the second integrated value exceeds the threshold value, the upper limit value for allowing discharge of the nonaqueous secondary battery is reduced. The second invention of the present application can also obtain the same effect as the first invention of the present application.

MODES FOR CARRYING OUT THE INVENTION

Embodiments of the present invention are described below.
First Embodiment

Figure 1:
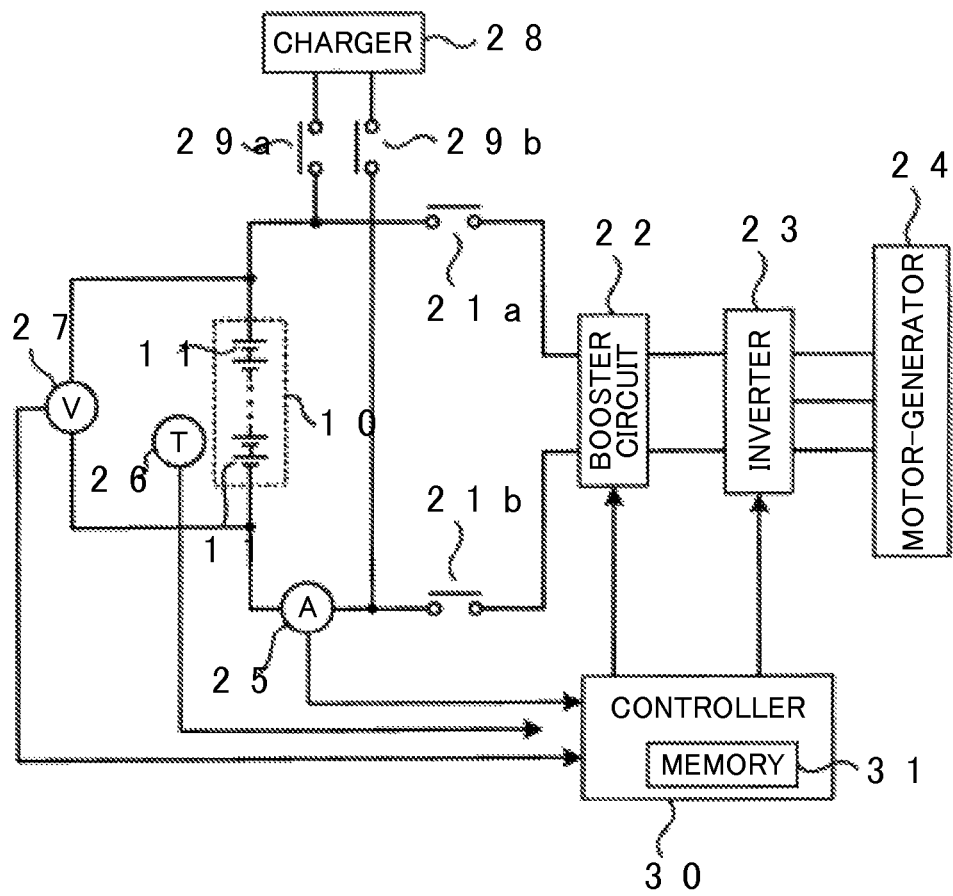
FIG. 1 shows a configuration of a battery system according to a first embodiment.

A battery system according to a first embodiment is described with reference to FIG. 1. FIG. 1 shows a configuration of the battery system.

The battery system shown in FIG. 1 is installed in a vehicle. The vehicle includes hybrid cars and electric cars. The hybrid car is a vehicle that includes a fuel cell, an internal combustion engine, and the like as a power source for the vehicle to run, in addition to an assembled battery. The electric car is a vehicle that includes only the assembled battery as a power source for the vehicle.

An assembled battery 10 includes a plurality of unit cells 11 that are electrically connected in series. The number of the unit cells 11 that constitute the assembled battery 10 can be set appropriately based on the required output and the like of the assembled battery 10. The assembled battery 10 may include the unit cells 11 that are electrically connected in parallel. As the unit cell 11, a nonaqueous secondary battery such as a lithium ion secondary battery can be used.

The positive pole of the unit cell 11 is formed of a material that can occlude and release ions (for example, lithium ions). As the material of the positive pole, lithium cobalt oxide or lithium manganese oxide can be used, for example. The negative pole of the unit cell 11 is formed from a material that can occlude and release ions (for example, lithium ions). As the material of the negative pole, carbon can be used, for example. When the unit cell 11 is charged, the positive pole releases ions into an electrolytic solution, and the negative pole occludes the ions in the electrolytic solution. When the unit cell 11 is discharged, the positive pole occludes the ions in the electrolytic solution, and the negative pole releases the ions into the electrolytic solution.

The assembled battery 10 is connected to a booster circuit 22 through system main relays 21a and 21b. The booster circuit 22 boosts the output voltage of the assembled battery 10. The booster circuit 22 is connected to an inverter 23. The inverter 23 converts DC power from the booster circuit 22 into AC power. A motor-generator (a three-phase AC motor) 24 receives the AC power from the inverter 23 to generate kinetic energy for the vehicle to run. The kinetic energy generated by the motor-generator 24 is transmitted to wheels.

The booster circuit 22 can be omitted. Further, when a DC motor is used as the motor-generator 24, the inverter 23 can be omitted.

When the vehicle is decelerated or when the vehicle is stopped, the motor-generator 24 converts kinetic energy generated at the time of braking of the vehicle into electrical energy. AC power generated by the motor-generator 24 is converted by the inverter 23 into DC power. The booster circuit 22 reduces the output voltage of the inverter 23, and then supplies the reduced output voltage to the assembled battery 10. Accordingly, regenerative electric power can be stored in the assembled battery 10.

A current sensor 25 detects the current that flows through the assembled battery 10, and outputs a result of the detection to a controller 30. A current value of the discharge current, detected by the current sensor 25, can be represented as a positive value, and a current value of the charge current, detected by the current sensor 25, can be represented as a negative value. A temperature sensor 26 detects the temperature of the assembled battery 10, and outputs a result of the detection to the controller 30. The number of the temperature sensors 26 can be set appropriately. When a plurality of the temperature sensors 26 are used, an average value of the temperatures detected by the temperature sensors 26 can be used as the temperature of the assembled battery 10, or the temperature detected by a specific one of the temperature sensors 26 can be used as the temperature of the assembled battery 10.

A voltage sensor 27 detects the voltage of the assembled battery 10, and outputs a result of the detection to the controller 30. In the present embodiment, the voltage of the assembled battery 10 is detected. However, the present invention is not limited thereto. For example, the voltage of the unit cell 11 that constitutes the assembled battery 10 can be detected. Further, the unit cells 11 that constitute the assembled battery 10 can be split into multiple blocks to detect the voltage of each of the blocks. Each of the blocks includes at least two unit cells 11.

The controller 30 controls respective operations of the system main relays 21a and 21b, the booster circuit 22, and the inverter 23. The controller 30 includes a memory 31 that stores therein various kinds of information. In the memory 31, a program for operating the controller 30 is also stored. In the present embodiment, the controller 30 has the memory 31 incorporated therein. However, the memory 31 can also be provided in the exterior of the controller 30.

When an ignition switch of the vehicle is switched from off to on, the controller 30 switches the system main relays 21a and 21b from off to on, and operates the booster circuit 22 and the inverter 23. When the ignition switch is switched from on to off, the controller 30 switches the system main relays 21a and 21b from on to off, and stops operating the booster circuit 22 and the inverter 23.

A charger 28 supplies electric power from an external power supply to the assembled battery 10. Thus, the assembled battery 10 can be charged. The charger 28 is connected to the assembled battery 10 through charging relays 29a and 29b. When the charging relays 29a and 29b are on, electric power from the external power supply can be supplied to the assembled battery 10.

The external power supply is a power supply provided in the exterior of the vehicle. Examples of the external power supply include a commercial power supply. When AC power is supplied by the external power supply, the charger 28 converts the AC power into DC power to supply the DC power to the assembled battery 10. In contrast, when DC power is supplied by the external power supply, the DC power from the external power supply may solely be supplied to the assembled battery 10. In the present embodiment, electric power of the external power supply can be supplied to the assembled battery 10. However, electric power of the external power supply may not be supplied to the assembled battery 10.

Figure 2:
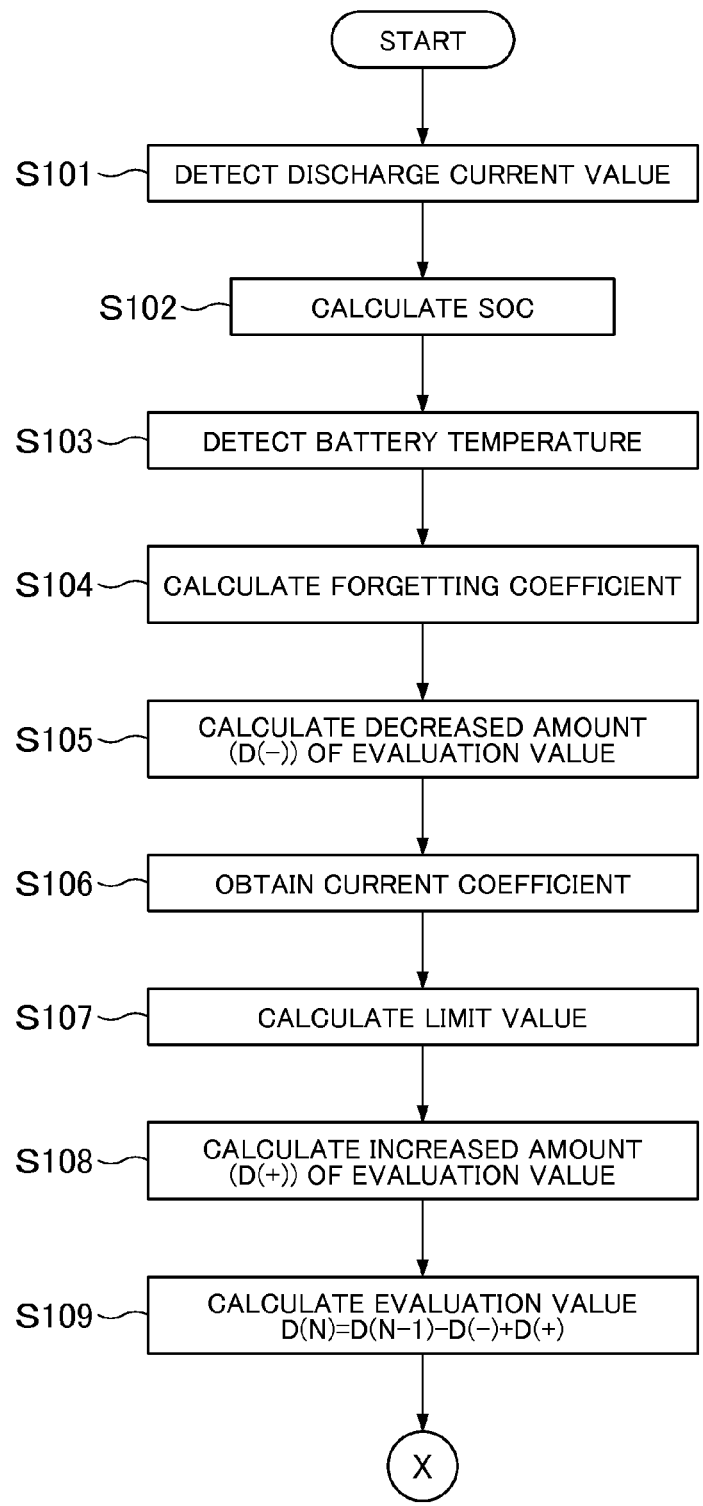
FIG. 2 is a flowchart of processing for controlling charge/discharge of an assembled battery in the first embodiment.
Figure 3:
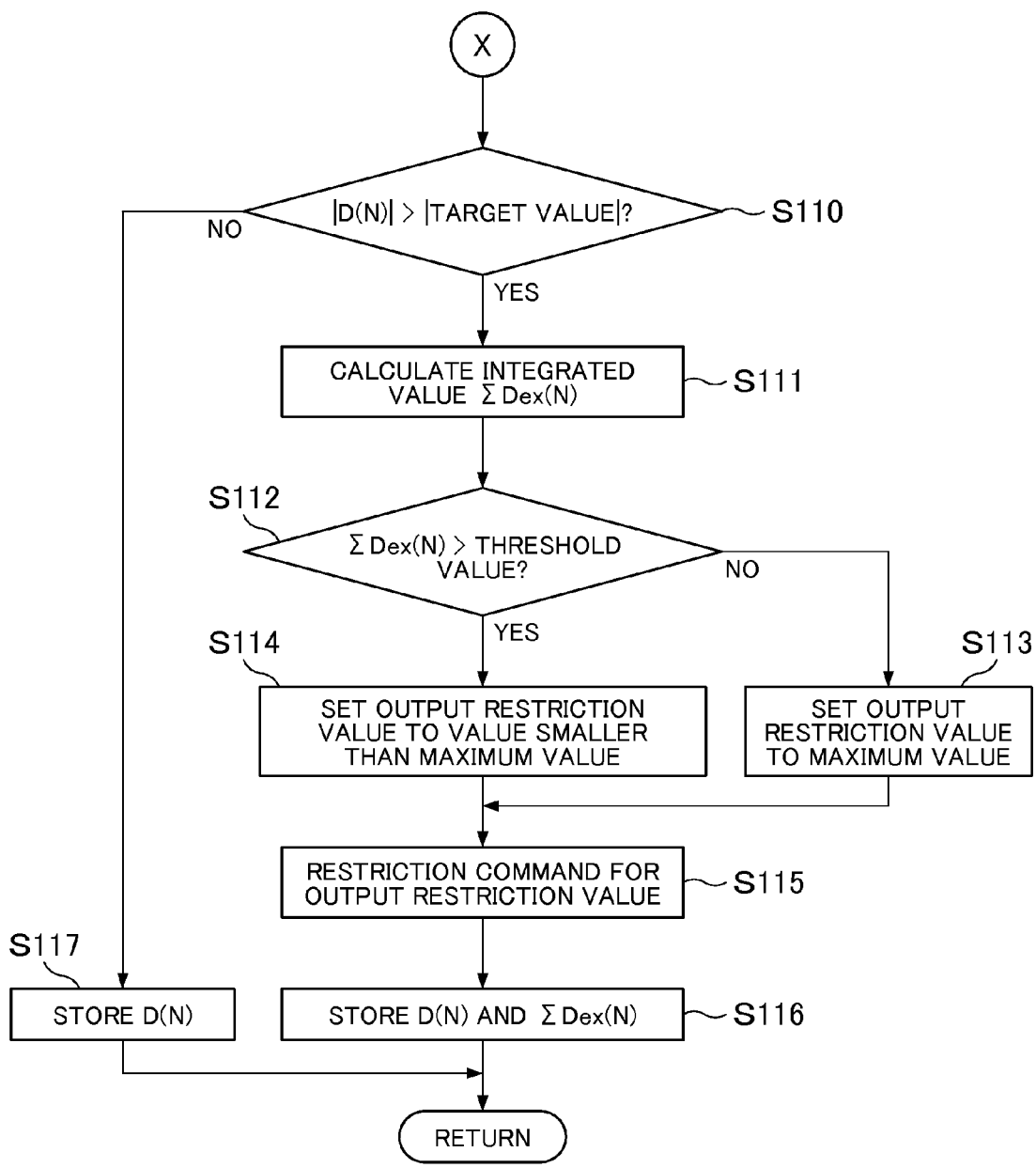
FIG. 3 is the flowchart of the processing for controlling charge/discharge of the assembled battery in the first embodiment.

Next, processing for controlling charge/discharge of the assembled battery 10 is described with reference to a flowchart shown in FIGS. 2 and 3. The processing shown in FIGS. 2 and 3 is repeatedly performed in a cycle time set in advance. The processing shown in FIGS. 2 and 3 is performed by executing the program stored in the memory 31 by a CPU included in the controller 30.

In step S101, the controller 30 obtains a discharge current value based on an output signal of the current sensor 25. When the assembled battery 10 is discharged, the discharge current value becomes a positive value. When the assembled battery 10 is charged, the discharge current value becomes a negative value.

In step S102, the controller 30 calculates (estimates) a state of charge (SOC) of the assembled battery 10 based on the discharge current value obtained in step S101. The SOC is a ratio of the presently charged capacity of the assembled battery 10 relative to its fully-charged capacity. The controller 30 can calculate the SOC of the assembled battery 10 by integrating the current values when the assembled battery 10 is charged/discharged. The current values when the assembled battery 10 is charged/discharged can be obtained from the output of the current sensor 25.

Meanwhile, the SOC of the assembled battery 10 can also be estimated from the voltage detected by the voltage sensor 27. There is a corresponding relationship between the SOC of the assembled battery 10 and an open circuit voltage (OCV) of the assembled battery 10. Consequently, by acquiring the corresponding relationship between the SOC and the OCV in advance, the SOC can be identified based on the OCV. The OCV can be acquired from a closed circuit voltage (CCV) of the voltage sensor 27 and from a voltage reduction amount due to the internal resistance of the assembled battery 10. A method of calculating the SOC is not limited to the method described in the present embodiment, and a publicly-known method can be selected appropriately.

In step S103, the controller 30 obtains the temperature of the assembled battery 10 based on an output signal of the temperature sensor 26. In step S104, the controller 30 calculates a forgetting coefficient based on the SOC calculated in step S102 and based on the temperature of the assembled battery 10 obtained in step S103. The forgetting coefficient is a coefficient that corresponds to a diffusion speed of ions in an electrolytic solution in the unit cell 11. The forgetting coefficient is set within a range that satisfies a condition of the following expression (1).

$$0 < A \times \Delta t < 1 \tag{1}$$

where A represents the forgetting coefficient, and $\Delta t$ represents the cycle time when the processing shown in FIGS. 2 and 3 is repeatedly performed.

Figure 4:
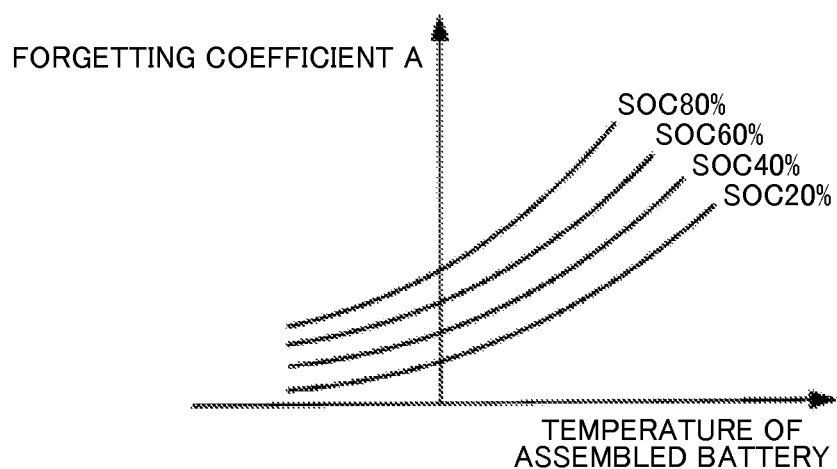
FIG. 4 shows a relationship between a temperature of the assembled battery and a forgetting coefficient.

For example, the controller 30 can use a map shown in FIG. 4 to identify the forgetting coefficient A. In FIG. 4, the vertical axis represents the forgetting coefficient A, and the horizontal axis represents the temperature of the assembled battery 10. The map shown in FIG. 4 can be obtained in advance by experiment or the like, and can be stored in the memory 31.

In the map shown in FIG. 4, the SOC obtained in step S102 and the temperature obtained in step S103 are identified, and consequently the forgetting coefficient A can be identified. As the ion diffusion speed is higher, the forgetting coefficient A is larger. In the map shown in FIG. 4, at the same temperature of the assembled battery 10, as the SOC of the assembled battery 10 is higher, the forgetting coefficient A is larger. Further, at same SOC of the assembled battery 10, as the temperature of the assembled battery 10 is higher, the forgetting coefficient A is larger.

In step S105, the controller 30 calculates a decreased amount D(−) of an evaluation value. An evaluation value D(N) is a value for evaluating the deterioration state (high-rate deterioration described later) of the assembled battery 10 (the unit cell 11).

When high-rate discharge of the unit cell 11 is performed continuously, the internal resistance of the unit cell 11 increases, which can cause a phenomenon in which the output voltage of the unit cell 11 starts decreasing sharply. When this phenomenon occurs continuously, the unit cell 11 can sometimes deteriorate. Deterioration due to high-rate discharge is referred to as "high-rate deterioration" (corresponding to a first deterioration component). One factor of the high-rate deterioration is considered to be imbalanced ion concentrations in an electrolytic solution in the unit cell 11 caused by continuous high-rate discharge.

It is necessary to suppress high-rate discharge before the high-rate deterioration occurs. In the present embodiment, the evaluation value D(N) is set as a value for evaluating the high-rate deterioration. A method of calculating the evaluation value D(N) is described later.

The decreased amount D(−) of the evaluation value is calculated according to a decrease in imbalance of ion concentrations due to ion diffusion from when the last (immediately-previous) evaluation value D(N−1) has been calculated to when one cycle time $\Delta t$ has elapsed. For example, the controller 30 can calculate the decreased amount D(−) of the evaluation value based on the following expression (2).

$$D(-) = A \times \Delta t \times D(N-1) \tag{2}$$

where A and $\Delta t$ respectively represent the same as those expressed in the expression (1). D(N−1) represents an evaluation value calculated at the last time (immediately previously). D(0) represented as an initial value can be 0, for example.

As expressed in the expression (1), a value of "A×$\Delta t$" is between 0 and 1. Consequently, as the value of "A×$\Delta t$" is closer to 1, the decreased amount D(−) of the evaluation value is larger. In other words, as the forgetting coefficient A is larger or the cycle time $\Delta t$ is longer, the decreased amount D(−) of the evaluation value is larger. A method of calculating the decreased amount D(−) is not limited to the method described in the present embodiment, and can be any method to identify a decrease in imbalance of ion concentrations.

In step S106, the controller 30 reads a current coefficient stored in advance in the memory 31. In step S107, the controller 30 calculates a limit value based on the SOC of the assembled battery 10 calculated in step S102, and based on the temperature of the assembled battery 10 obtained in step S103.

Figure 5:
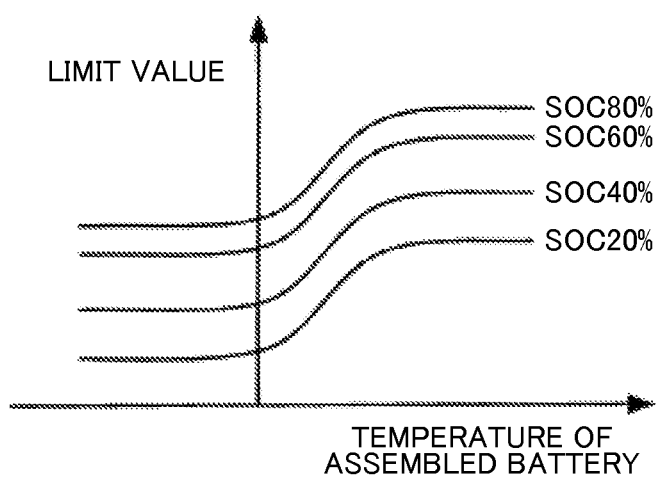
FIG. 5 shows a relationship between a temperature of the assembled battery and a limit value.

For example, the controller 30 can use a map shown in FIG. 5 to calculate the limit value. The map shown in FIG. 5 can be obtained in advance by experiment or the like, and can be stored in the memory 31. In FIG. 5, the vertical axis represents the limit value, and the horizontal axis represents the temperature of the assembled battery 10. In the map shown in FIG. 5, the SOC obtained in step S102 and the temperature obtained in step S103 are identified, and consequently the limit value can be identified.

In the map shown in FIG. 5, at the same temperature of the assembled battery 10, as the SOC of the assembled battery 10 is higher, the limit value is larger. Further, at the same SOC of the assembled battery 10, as the temperature of the assembled battery 10 is higher, the limit value is larger.

In step S108, the controller 30 calculates an increased amount D(+) of the evaluation value. The increased amount D(+) of the evaluation value is calculated according to an increase in imbalance of ion concentrations due to discharge from when the last (immediately-previous) evaluation value D(N−1) has been calculated to when one cycle time $\Delta t$ has elapsed. For example, the controller 30 can calculate the increased amount D(+) of the evaluation value based on the following expression (3).

$$D(+) = B/C \times I \times \Delta t \tag{3}$$

where B represents the current coefficient, in which the value obtained by the processing in step S106 is used, C represents the limit value, in which the value obtained by the processing in step S107 is used, I represents the discharge current value, in which the value obtained by the processing in step S101 is used, and $\Delta t$ represents the cycle time.

As understood from the expression (3), as the discharge current value I is larger or as the cycle time $\Delta t$ is longer, the increased amount D(+) of the evaluation value is larger. A method of calculating the increased amount D(+) is not limited to the calculation method described in the present embodiment, and can be any method to identify an increase in imbalance of ion concentrations.

In step S109, the controller 30 calculates the evaluation value D(N) in the present cycle time $\Delta t$. The evaluation value D(N) can be calculated based on the following expression (4).

$$D(N) = D(N-1) - D(-) + D(+) \tag{4}$$

where D(N) represents the evaluation value in the present cycle time $\Delta t$, and D(N−1) is the evaluation value in the last (immediately-previous) cycle time $\Delta t$. D(0) represented as an initial value can be set to 0, for example. D(−) and D(+) represent a decreased amount and an increased amount of the evaluation value D, respectively. The values calculated respectively in steps S105 and S108 are used as D(−) and D(+).

In the present embodiment, as expressed by the expression. (4), the evaluation value D(N) can be calculated taking into account an increase in imbalance of ion concentrations and a decrease in imbalance of ion concentrations. Thus, a change (increase/decrease) in imbalance of ion concentrations, which is considered to be a factor of high-rate deterioration, can be appropriately reflected in the evaluation value D(N). Therefore, how close the state of the assembled battery 10 is to a state where high-rate deterioration occurs can be recognized based on the evaluation value D(N).

In step S110, the controller 30 determines whether or not the evaluation value D(N) calculated in step S109 exceeds a preset target value. The target value is set to a value smaller than the evaluation value D(N) at which high-rate deterioration starts occurring, and can be set in advance. When the evaluation value D(N) exceeds the target value, the processing advances to step S111. When the evaluation value D(N) does not exceed the target value, the processing advances to step S117.

Figure 6:
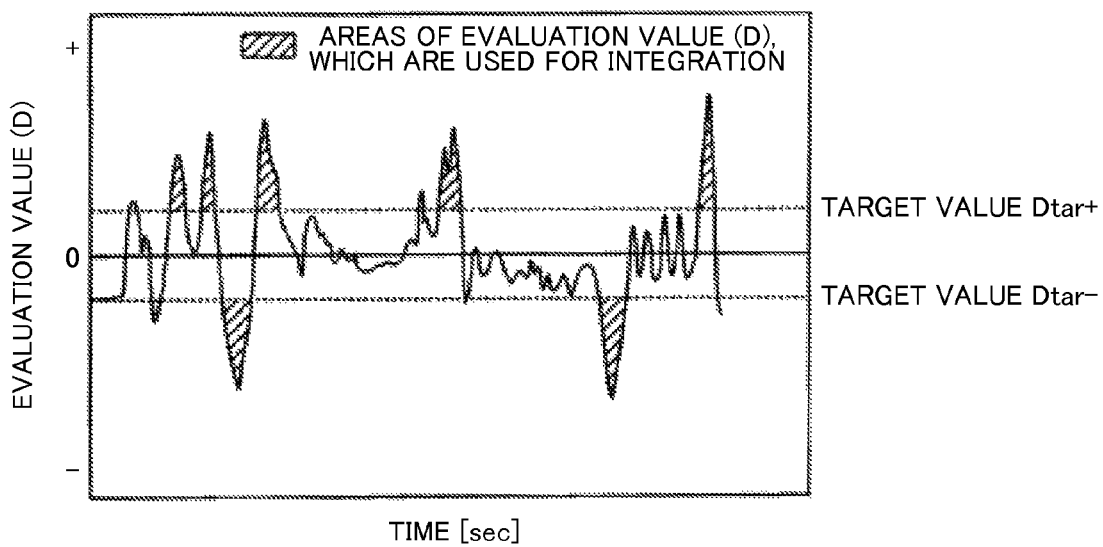
FIG. 6 shows a change in evaluation value.

In the present embodiment, as shown in FIG. 6, a target value Dtar+ is set on the positive side of the evaluation value D(N) and a target value Dtar− is set on the negative side of the evaluation value D(N). FIG. 6 shows a change in the evaluation value D(N) (as an example). The target value Dtar+ is a positive value, and the target value Dtar− is a negative value. The target values Dtar+ and Dtar− have the same absolute value. In step S110, when the evaluation value D(N) is larger than the target value Dtar+ and when the evaluation value D(N) is smaller than the target value Dtar−, the processing advances to step S111. That is, when the absolute value of the evaluation value D(N) is larger than the absolute value of the target values Dtar+ and Dtar−, the processing advances to step S111.

In step S111, the controller 30 integrates the evaluation values D(N). Specifically, as shown in FIG. 6, when the evaluation value D(N) exceeds the target value Dtar+ or the target value Dtar−, portions of the evaluation value D(N), which exceed the target value Dtar+ or the target value Dtar−, are integrated. The integration processing is performed each time the evaluation value D(N) exceeds the target value Dtar+ or the target value Dtar−.

When the evaluation value D(N) is larger than the target value Dtar+, the difference between the evaluation value D(N) and the target value Dtar+ is added. In contrast, when the evaluation value D(N) is smaller than the target value Dtar−, the difference between the evaluation value D(N) and the target value Dtar− is subtracted.

In the present embodiment, an integrated value $\Sigma D_{ex}(N)$ corresponding to a second integrated value) is calculated based on the following expression (5).

[Expression 1]

$$\Sigma D_{ex}(N) = a \times \Sigma D_{ex}(N-1) + D_{ex}(N)$$

$$0 < a < 1 \quad (5)$$

In the expression (5), "a" is a correction coefficient, and is a value larger than 0 and smaller than 1. $\Sigma D_{ex}(N-1)$ is a value (corresponding to a first integrated value) obtained by accumulating the difference between the evaluation value D and the target value Dtar+ and the difference between the evaluation value D and the target value Dtar− in the last and earlier cycle times. Dex(N) is the difference, between the evaluation value D(N) and the target value Dtar+ and the difference between the evaluation value D(N) and the target value Dtar−, which are obtained in the present cycle time.

Information regarding the correction coefficient "a" can be stored in the memory 31. The correction coefficient "a" is a value larger than 0 and smaller than 1. Accordingly, when the integrated value $\Sigma D_{ex}(N)$ is calculated in the present cycle time, the integrated value $\Sigma D_{ex}(N-1)$, obtained in the last and earlier cycle times, is decreased. The evaluation value D(N) is a value for evaluating high-rate deterioration. However, the high-rate deterioration can sometimes be lessened under certain conditions. It is conceivable that high-rate deterioration occurs due to an excessive imbalance of ion concentrations. Thus, when the imbalance of ion concentrations is lessened, the high-rate deterioration is also lessened.

When charge/discharge of the assembled battery 10 is rested, the imbalance of ion concentrations is lessened by ion diffusion, and the amount of resistance increase due to high-rate deterioration is decreased. As charge/discharge of the assembled battery 10 is rested for a longer time, the imbalance of ion concentrations is more likely to be lessened. Further, depending on the vehicle running pattern, the imbalance of ion concentrations can sometimes be lessened. Furthermore, after high-rate discharge is performed, when the assembled battery 10 is charged using the external power supply, ions can be moved in a direction to lessen the imbalance of ion concentrations.

Figure 7:
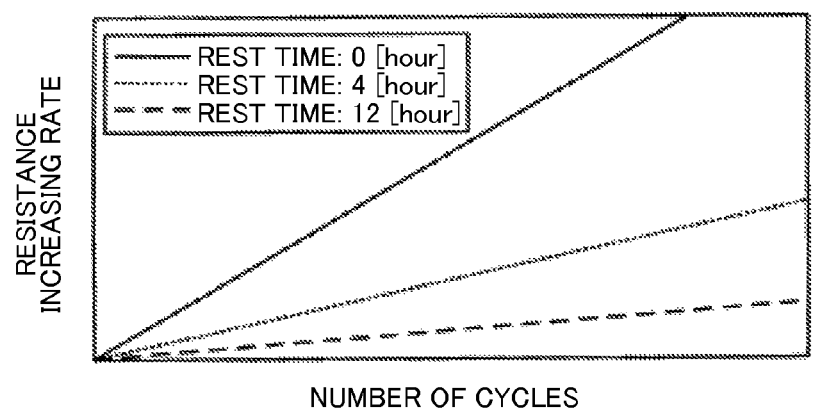
FIG. 7 shows a change in resistance increasing rate when charge/discharge of the assembled battery is rested, and shows a change in resistance increasing rate when charge/discharge of the assembled battery is not rested.

FIG. 7 shows a change in resistance increasing rate when charge/discharge of the assembled battery 10 is rested (an experimental result), and shows a change in resistance increasing rate when charge/discharge of the assembled battery 10 is not rested (an experimental result). In FIG. 7, the horizontal axis represents the number of cycles, and the vertical axis represents the resistance increasing rate. The resistance increasing rate is a value that represents how much a resistance (Rr) of the assembled battery 10 in a deterioration state increases relative to a resistance (Rini) of the assembled battery 10 in an initial state. The resistance increasing rate can be represented as a ratio between two resistances (Rr/Rini), for example. When high-rate deterioration develops, the resistance increasing rate increases.

In one cycle, the SOC of the assembled battery 10 is changed from an upper limit value SOC_max to a lower limit value SOC_min by discharging the assembled battery 10, and then the SOC of the assembled battery 10 is changed from the lower limit value SOC_min to the upper limit value SOC_max by charging the assembled battery 10. The rate [C] at which the assembled battery 10 is discharged and the rate[C] at which the assembled battery 10 is charged are equal to each other. The discharge rate [C] is set to the rate [C] at which high-rate deterioration is more likely to occur.

Figure 8:
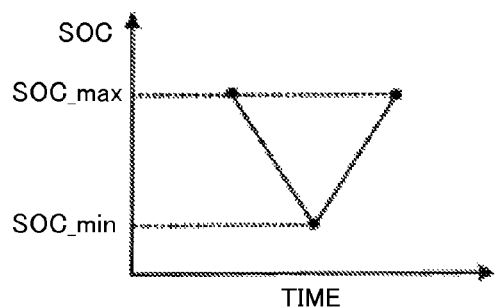
FIG. 8 is an explanatory diagram for illustrating measurement conditions of the resistance increasing rate when charge/discharge of the assembled battery is not rested.

When charge/discharge of the assembled battery 10 is not rested, as shown in FIG. 8, immediately after the SOC of the assembled battery 10 is changed from the upper limit value SOC_max to the lower limit value SOC_min, the SOC of the assembled battery 10 is changed from the lower limit value SOC_min to the upper limit value SOC_max. This processing is regarded as one cycle, and is performed repeatedly. When the number of the cycles reaches a predetermined number, the resistance (Rr) of the assembled battery 10 is measured to acquire the resistance increasing rate. A change in the resistance increasing rate at this time is shown in FIG. 7 as an experimental result when a rest time t_rest is 0 [hour].

Figure 9:
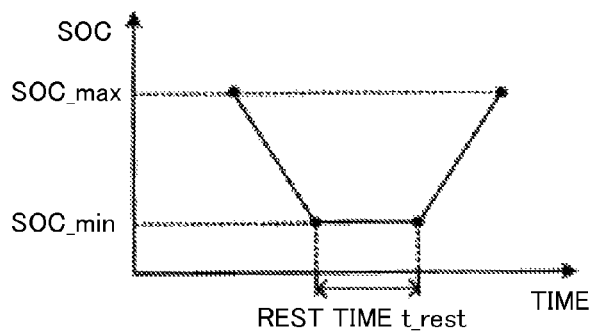
FIG. 9 is an explanatory diagram for illustrating measurement conditions of the resistance increasing rate when charge/discharge of the assembled battery is rested.

When charge/discharge of the assembled battery 10 is rested, as shown in FIG. 9, after the SOC of the assembled battery 10 is changed from the upper limit value SOC_max to the lower limit value SOC_min, charge/discharge of the assembled battery 10 is rested for a predetermined time t_rest. After charge/discharge of the assembled battery 10 is rested, the SOC of the assembled battery 10 is changed from the lower limit value SOC_min to the upper limit value SOC_max. This processing is regarded as one cycle, and, is performed repeatedly. When the number of the cycles reaches a predetermined number, the resistance (Rr) of the assembled battery 10 is measured to acquire the resistance increasing rate. A change in the resistance increasing rate at this time is shown in FIG. 7 as an experimental result when the rest time t_rest is 4 [hour] and 12 [hour].

As shown in FIG. 7, when charge/discharge of the assembled battery 10 is not rested, the resistance increasing rate of the assembled battery 10 increases more easily. In contrast, when charge/discharge of the assembled battery 10 is rested, the resistance increasing rate of the assembled battery 10 increases less easily. Further, as the rest time t_rest is longer, the resistance increasing rate of the assembled battery 10 increases even less easily. Accordingly, it is understood that high-rate deterioration (an increase in resistance increasing rate) can be suppressed by resting charge/discharge of the assembled battery 10.

As described above, high-rate deterioration can be lessened under various conditions. Thus, in the present embodiment, the integrated value $\Sigma Dex(N-1)$ is multiplied by the correction coefficient "a". ($0<a<1$), and thus the integrated value $\Sigma Dex(N-1)$ is corrected taking into account lessening of high-rate deterioration. The correction coefficient "a" can be set in advance taking into account the increase in the resistance increasing rate due to high-rate deterioration. When the correction coefficient "a" is closer to 0, the ratio of the integrated value $\Sigma Dex(N-1)$ within the integrated value $\Sigma Dex(N)$ decreases. When the correction coefficient "a" is closer to 1, the ratio of the integrated value $\Sigma Dex(N-1)$ within the integrated value $\Sigma Dex(N)$ increases.

As described later, when the integrated value $\Sigma Dex(N)$ is larger than a threshold value K, the output (discharge) of the assembled battery 10 is restricted. The integrated value $\Sigma Dex(N-1)$ is decreased by using the correction coefficient "a," and thus the integrated value $\Sigma Dex(N)$ can be prevented from easily becoming larger than the threshold value K.

When the integrated value $\Sigma Dex(N-1)$ is not corrected by using the correction coefficient "a," the integrated value $\Sigma Dex(N)$ reaches the threshold value K more easily. As described above, high-rate deterioration is lessened by resting charge/discharge of the assembled battery 10 or by other methods, and even in a real vehicle, there is the time for resting charge/discharge of the assembled battery 10. When the integrated value $\Sigma Dex(N-1)$ is not corrected, the integrated value $\Sigma Dex(N)$ reaches the threshold value K more easily because the rest of charge/discharge of the assembled battery 10 or the like is not taken into account, and there is a possibility of restricting the output of the assembled battery 10 more than necessary. The output of the assembled battery 10 is restricted more than necessary, which cannot produce output performance of the assembled battery 10 to a maximum extent.

According to the present embodiment, the integrated value $\Sigma Dex(N-1)$ is corrected taking into account lessening of high-rate deterioration, and thus the integrated value $\Sigma Dex(N)$ in which the actual deterioration state of the assembled battery 10 is reflected can be obtained. Charge/discharge of the assembled battery 10 is controlled based on the integrated value $\Sigma Dex(N)$, and therefore the output of the assembled battery 10 can be prevented from being restricted more than necessary. Further, an appropriate output of the assembled battery 10 can be ensured, and when the vehicle runs using the output of the assembled battery 10, the vehicle running distance can be extended.

In the present embodiment, at the time of calculating the integrated value $\Sigma Dex(N)$, when the evaluation value $D(N)$ is smaller than the target value Dtar−, the difference between the evaluation value $D(N)$ and the target value Dtar− is subtracted. However, the present invention is not limited thereto. Specifically, only when the evaluation value $D(N)$ is larger than the target value Dtar+, calculation of the integrated value $\Sigma Dex(N)$ can be performed. In this case, each time the evaluation value $D(N)$ becomes larger than the target value Dtar+, the difference between the evaluation value $D(N)$ and the target value Dtar+ is added. As described above, the integrated value $\Sigma Dex(N-1)$ can be corrected by the correction coefficient "a."

In the present embodiment, at the time of calculating the integrated value $\Sigma Dex(N)$, the difference between the evaluation value $D(N)$ and the target value Dtar+ and the difference between the evaluation value $D(N)$ and the target value Dtar− are integrated. However, the present invention is not limited thereto. Specifically, when the evaluation value $D(N)$ is larger than the target value Dtar+, this evaluation value $D(N)$ can be added, and when the evaluation value $D(N)$ is smaller than the target value Dtar−, this evaluation value $D(N)$ can be subtracted. In this case, the threshold value K described later may be changed taking into account the target values Dtar+ and Dtar−. As described above, the integrated value $\Sigma Dex(N-1)$ can be corrected by the correction coefficient "a."

In step S112, the controller 30 determines whether or not the integrated value $\Sigma Dex(N)$ is larger than the threshold value K. The threshold value K is a value for allowing high-rate deterioration. In step S112, when the integrated value $\Sigma Dex(N)$ is larger than the threshold value K, the processing advances to step S114, and when the integrated value $\Sigma Dex(N)$ is not larger than the threshold value K, the processing advances to step S113.

Figure 10:
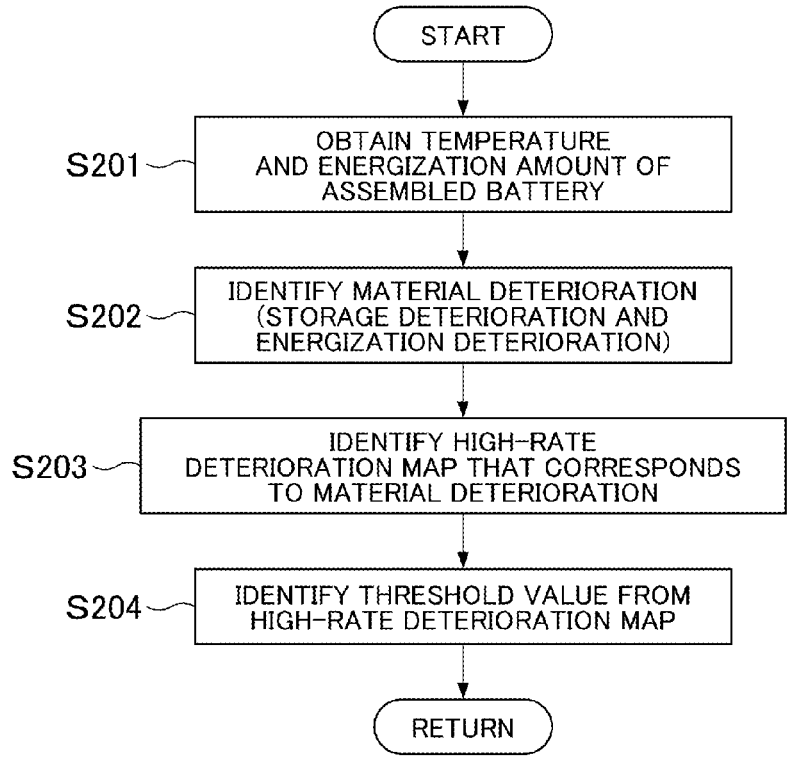
FIG. 10 is a flowchart of processing for determining a threshold value.

The threshold value K is not a fixed value, but is changed according to the deterioration state of the assembled battery 10 (the unit cell 11), in other words, according to the way the assembled battery 10 is used. A method of determining the threshold value K is described with reference to FIG. 10.

In step S201, the controller 30 obtains the temperature of the assembled battery 10 when its charge/discharge is not performed, the temperature of the assembled battery 10 when its charge/discharge is performed, and the energization amount of the assembled battery 10 when its charge/discharge is performed. A case in which charge/discharge of the assembled battery 10 is not performed is, for example, one in which the vehicle with the assembled battery 10 installed therein is left alone. The temperature of the assembled battery 10 can be obtained based on the output of the temperature sensor 26. The energization amount can be obtained based on the output of the current sensor 25.

In order to obtain the temperature of the assembled battery 10 when its charge/discharge is not performed, a temperature sensor (different from the temperature sensor 26) that is provided in the vehicle in advance to detect the outside air temperature can be used. As the temperature of the assembled battery 10 when its charge/discharge is not performed, a detection result from the temperature sensor 26, obtained immediately after the ignition switch is switched from off to on, can also be used. Meanwhile, when charge/discharge of the assembled battery 10 is not performed due to the stop of the vehicle, the controller 30 starts-up at a predetermined interval, and can obtain the temperature of the assembled battery 10 based on the output of the temperature sensor 26.

In step S202, the controller 30 identifies (estimates) material deterioration of the assembled battery 10 (the unit cell 11) based on the information obtained in step S201. Deterioration of the assembled battery 10 (the unit cell 11) is classified into high-rate deterioration and material deterioration. The material deterioration (corresponding to a second deterioration component) is deterioration dependent on a material of a member that constitutes the unit cell 11. Further, the material deterioration is classified into a deterioration component when charge/discharge of the assembled battery 10 is not performed (referred to as "storage deterioration") and into a deterioration component when charge/discharge of the assembled battery 10 is performed (referred to as "energization deterioration").

The storage deterioration can be identified based on the temperature of the assembled battery 10 when its charge/discharge is not performed, in other words, the temperature of the assembled battery 10 when the vehicle is left alone. A map showing a corresponding relationship between the storage deterioration and the temperature of the assembled battery 10 when its charge/discharge is not performed can be prepared in advance to identify the storage deterioration. The map for identifying the storage deterioration can be stored in the memory 31 in advance. When the storage deterioration occurs, the resistance of the assembled battery 10 increases. Accordingly, the storage deterioration can be defined by the resistance increasing rate, for example.

The energization deterioration can be identified based on the temperature and energization amount of the assembled battery 10 when its charge/discharge is performed. A map showing a corresponding relationship between the energization deterioration and the temperature and energization amount of the assembled battery 10, when its charge/discharge is performed can be prepared in advance to identify the energization deterioration. The map for identifying the energization deterioration can be stored in the memory 31 in advance. When the energization deterioration occurs, the resistance of the assembled battery 10 increases. Accordingly, the energization deterioration can be defined by the resistance increasing rate, for example. When the storage deterioration and the energization deterioration can be identified, the material deterioration can be identified.

Figure 11:
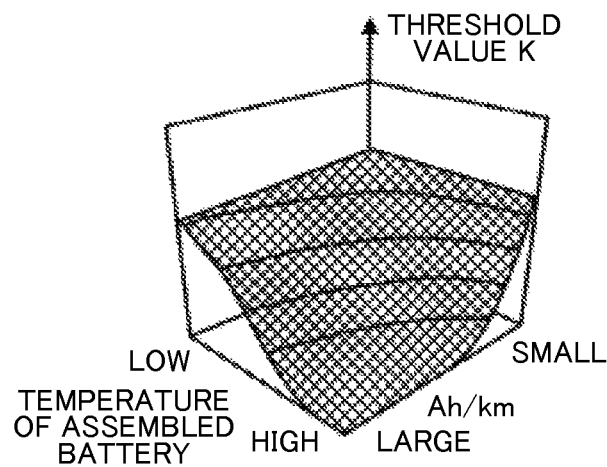
FIG. 11 shows a map for identifying the threshold value.
Figure 12:
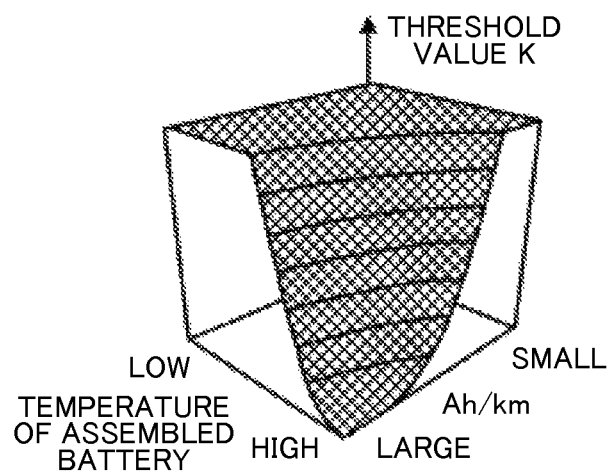
FIG. 12 shows a map for identifying the threshold value.

In step S203, the controller 30 identifies a high-rate deterioration map for determining the threshold value K based on the material deterioration identified in step S202. As shown in FIGS. 11 and 12, the high-rate deterioration map shows a relationship between the threshold value K, the temperature (the average temperature) of the assembled battery 10 when its charge/discharge is performed, and the usage state (Ah/km) of the assembled battery 10. The usage state (Ah/km) of the assembled battery 10 is the charged/discharged amount of the assembled battery 10 relative to the vehicle running distance, and can be calculated based on the output of a running-distance sensor and the output of the current sensor 25.

The maps in FIGS. 11 and 12 show different degrees of the material deterioration from each other. The material deterioration corresponding to the map shown in FIG. 11 is severer than the material deterioration corresponding to the map shown in FIG. 12. Deterioration of the assembled battery 10 (the unit cell 11) is classified into material deterioration and high-rate deterioration. Thus, as the material deterioration is severer, the ratio that allows the high-rate deterioration becomes lower, and accordingly the threshold value K becomes smaller. The threshold value K shown in FIG. 11 is smaller than the threshold value K shown in FIG. 12.

For example, because material deterioration is less likely to occur in a low-temperature environment, the ratio that allows high-rate degradation can become higher. Multiple types of the maps shown in FIGS. 11 and 12 can be prepared according to the degree of material deterioration to identify a map that corresponds to the material deterioration identified in step S202. The maps shown in FIGS. 11 and 12 can be stored in the memory 31 in advance.

In step S204, the controller 30 identifies the threshold value K using the high-rate deterioration map identified in step S203. Specifically, the controller 30 obtains the temperature of the assembled battery 10 and the usage state (Ah/km) of the assembled battery 10, and identifies the threshold value K that corresponds to the temperature and usage state (Ah/km) of the assembled battery 10. The threshold value K is used for the processing in step S112 in FIG. 3.

In step S113 in FIG. 3, the controller 30 sets an output restriction value, used for controlling charge/discharge of the assembled battery 10, to a maximum value. The output restriction value is an upper limit value (electric power [kW]) for allowing discharge of the assembled battery 10. The controller 30 controls discharge of the assembled battery 10 in order that output electric power of the assembled battery 10 does not exceed the output, restriction value.

The maximum value of the output restriction value can be predetermined. When the output of the assembled battery 10 is restricted, the output restriction value is changed to a value smaller than the maximum value. The output restriction value can be changed between the maximum value and a minimum value. The minimum value of the output restriction value can be 0 [kw], for example. In this case, discharge of the assembled battery 10 is prohibited.

In step S114, the controller 30 sets the output restriction value to a value smaller than the maximum value. As the output restriction value is smaller, the output of the assembled battery 10 is more restricted. According to the difference between the integrated value $\Sigma Dex(N)$ and the threshold value K, the controller 30 can set an amount of decreasing the output restriction value relative to the maximum value. For example, the controller 30 can calculate the output restriction value based on the following expression (6).

$$Wout = Wout(MAX) - L \times (\Sigma Dex(N) - K) \tag{6}$$

where Wout represents the output restriction value used for discharge control, Wout(MAX) represents the maximum value of the output restriction value, L represents a coefficient, and K represents the threshold value K descried in step S112.

A value of "$L \times (\Sigma Dex(N) - K)$" represents the amount of decreasing the output restriction value, and this amount of decreasing the output restriction value can be adjusted by changing the coefficient L. Specifically, the amount of decreasing the output restriction value can be adjusted taking into account the drivability of the vehicle.

In step S115, the controller 30 transmits a command for controlling discharge of the assembled battery 10 to the inverter 23. This command includes information regarding the output restriction value set in step S113 or step S114. Therefore, discharge of the assembled battery 10 is controlled in order that discharge electric power of the assembled battery 10 does not exceed the output restriction value.

In step S116, the controller 30 stores the present evaluation value D(N) and the integrated value $\Sigma Dex(N)$ in the memory 31. The evaluation value D(N) is stored in the memory 31, and thus a change in the evaluation value D(N) can be monitored. Further, the integrated value $\Sigma Dex(N)$ is stored in the memory 31, and thus when the next evaluation value D(N+1) exceeds the target value Dtar+ or the target value Dtar−, the integrated value $\Sigma Dex(N)$ can be updated.

When the processing advances from step S110 to step S117, the controller 30 stores the evaluation value D(N) in the memory 31 in step S117. Accordingly, a change in the evaluation value D(N) can be monitored.

According to the present embodiment, when the integrated value Dex(N) is larger than the threshold value K, discharge of the assembled battery 10 is restricted, and therefore deterioration of the assembled battery 10 (the unit cell 11) due to high-rate discharge can be suppressed. Further, the output restriction value remains set to the maximum value until the integrated value $\Sigma Dex(N)$ reaches the threshold value K.

Therefore, vehicle dynamic performance required by a driver can be produced using the output of the assembled battery 10.

Figure 13:
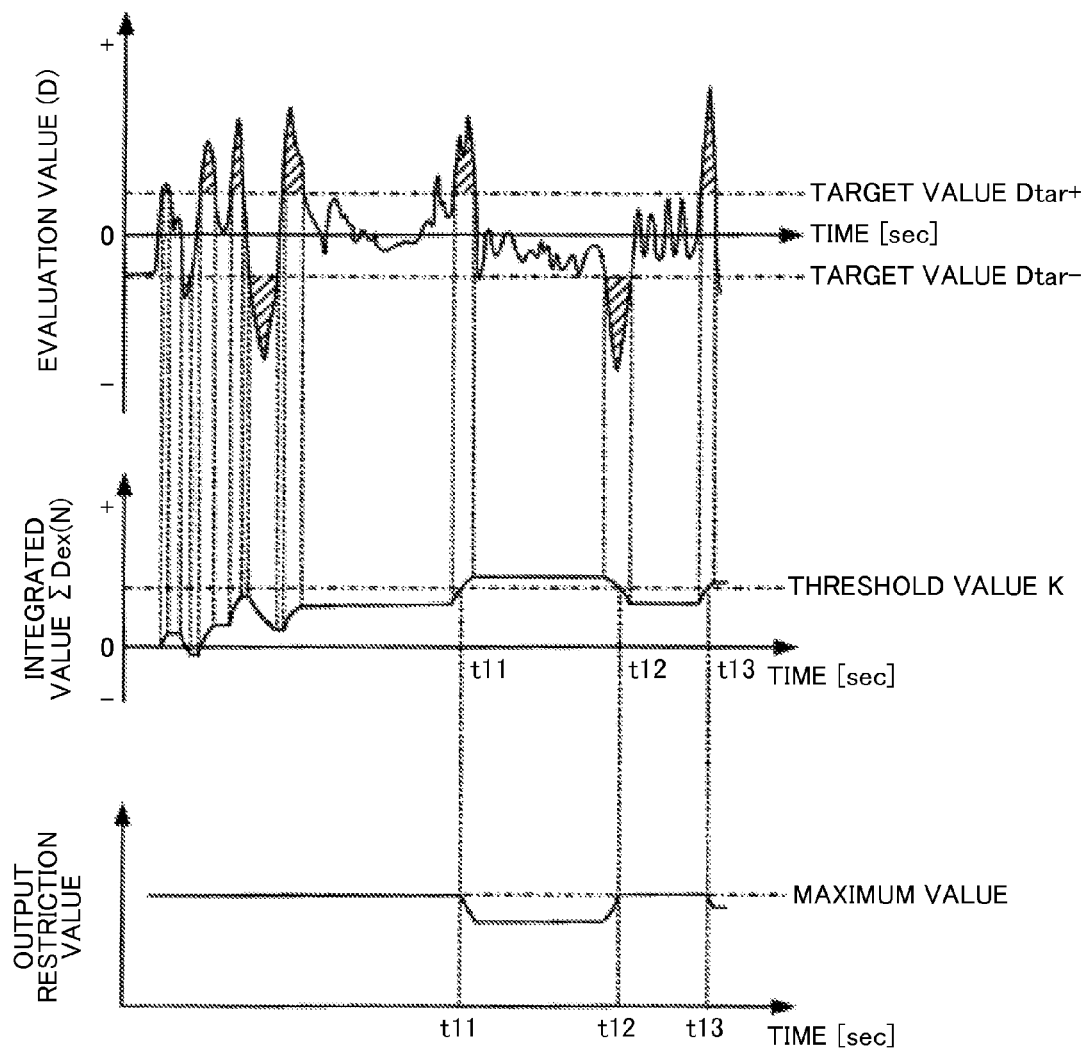
FIG. 13 shows a change in evaluation value, a change in integrated value, and a change in output restriction value in the first embodiment.

FIG. 13 shows a change in the integrated value ΣDex(N) and a change in the output restriction value (as an example) with a change in the evaluation value D(N).

Each time the evaluation value D(N) exceeds the target value Dtar+ or the target value Dtar−, the integrated value ΣDex(N) is updated. When the integrated value ΣDex(N) reaches the threshold value K at time t11, the output restriction value is changed. Therefore, discharge of the assembled battery 10 is further restricted. As the integrated value ΣDex(N) becomes larger than the threshold value K, the output restriction value becomes smaller. In contrast, the output restriction value is maintained at the maximum value until the integrated value ΣDex(N) reaches the threshold value K.

At time t12, the integrated value ΣDex(N) becomes smaller than the threshold value K. Therefore, the output restriction value is set to the maximum value. In a time period before the time t12, the output restriction value is approaching the maximum value as the time period is approaching the time t12. From the time t12 to time t13, the output restriction value is set to the maximum value. Because the integrated value ΣDex(N) becomes larger than the threshold value K at the time t13, the output restriction value is changed. As the integrated value ΣDex(N) becomes larger than the threshold value K, the output restriction value becomes smaller.

In the present embodiment, the output restriction value is not changed at such a timing that the evaluation value D(N) exceeds the target value Dtar+ or the target value Dtar−, but the output restriction value is changed when the integrated value ΣDex(N) becomes larger than the threshold value K. By performing the control as described above, even after the evaluation value D(N) exceeds the target value Dtar+ or the target value Dtar−, discharge of the assembled battery 10 can be performed in a state where the output restriction value is set to the maximum value, and vehicle dynamic performance as required by a driver can be ensured.

Further, according to the present embodiment, material deterioration of the unit cell 11 is estimated, and therefore an allowable range of high-rate deterioration can be identified. The threshold value K is set corresponding to the allowable range of high-rate deterioration, and therefore the assembled battery 10 can be discharged within the allowable range of high-rate deterioration. When discharge, of the assembled battery 10 is ensured, vehicle dynamic performance as required by a driver can be ensured.

In the present embodiment, the evaluation value D(N) is stored in the memory 31 in each cycle time Δt, and the last (immediately-previous) evaluation value D(N−1) stored in the memory 31 is used to calculate the present evaluation value D(N). However, the present invention is not limited thereto. Specifically, the evaluation value D(N) can be calculated based on the records of the discharge current value. The evaluation value D(N) is changed according to a change in the discharge current value, and therefore can be calculated by obtaining the records of the discharge current value. For example, only the records of the discharge current value are stored in the memory 31, and the stored records of the discharge current value can be used to calculate the evaluation value D(N) in a specific cycle time Δt.

In the present embodiment, the target values Dtar+ and Dtar− used in step S110 in FIG. 3 are fixed values set in advance, but are not limited thereto. That is, the target values Dtar+ and Dtar− can also be changed.

Specifically, similarly to the present embodiment, material deterioration is estimated to identify an allowable range of high-rate deterioration. When the allowable range of high-rate deterioration is smaller than a preset reference range, the target values Dtar+ and Dtar− can be set to values smaller than target values Dtar+ and Dtar− that correspond to the reference range, respectively. In contrast, when the allowable range of high-rate deterioration is larger than the reference range, the target values Dtar+ and Dtar− can be set to values larger than target values Dtar+ and Dtar− that correspond to the reference range.

The target values Dtar+ and Dtar− that correspond to the reference range can be the target values Dtar+ and Dtar− described in the present embodiment, for example. When the target values Dtar+ and Dtar− are changed, the threshold value K can be a fixed value.

When the target values Dtar+ and Dtar− are made smaller, these target values Dtar+ and Dtar− are closer to 0. The target values Dtar+ and Dtar− are changed in this manner, and therefore the difference between the evaluation value D(N) and the target value Dtar+, and the difference between the evaluation value D(N) and the target value Dtar− can be increased. Accordingly, the integrated value ΣDex(N) becomes larger than the threshold value K more easily, and discharge of the assembled battery 10 can be restricted more easily.

In contrast, when the target values Dtar+ and Dtar− are made larger, these target values Dtar+ and Dtar− are changed to values further from 0. The target values Dtar+ and Dtar− are changed in this manner, and therefore the difference between the evaluation value D(N) and the target value Dtar+, and the difference between the evaluation value D(N) and the target value Dtar− can be decreased. Accordingly, the integrated value ΣDex(N) becomes larger than the threshold value K less easily, and discharge of the assembled battery 10 may not be restricted.

Second Embodiment

A battery system according to a second embodiment of the present invention is described. Also in the battery system according to the present embodiment, the processing shown in FIGS. 2 and 3 is performed. A method of calculating the integrated value ΣDex(N) (the processing in step S111 in FIG. 3) in the present embodiment is different from the method in the first embodiment. Because other processing is the same as the processing described in the first embodiment, the detailed descriptions are omitted. Hereinafter, points different from the first embodiment are mainly described.

In the present embodiment, the integrated value ΣDex(N) is calculated based on the following expression (7).

[Expression 2]

$$\Sigma D_{ex}(N) = \frac{\{a \times \Sigma D_{ex}(N-1)(T-\Delta t) + D_{ex}(N)\Delta t\}}{T} \quad 0 < a < 1 \quad (7)$$

In the expression (7), T represents a preset period, and can be set appropriately. "a" is a correction coefficient, and is a value larger than 0 and smaller than 1. ΣDex(N−1) is a value obtained by accumulating the difference between the evaluation value D and the target value Dtar+ and the difference between the evaluation value D and the target value Dtar− in the last and earlier cycle times (T−Δt). Dex(N) is the difference between the evaluation value D(N) and the target value Dtar+ and the difference between the evaluation value D(N) and the target value Dtar−, which are obtained in the present cycle time (Δt).

The integrated value ΣDex(N−1) described in the first embodiment is a value obtained by continuous accumulation of the difference between the evaluation value D and the target value Dtar+ and the difference between the evaluation value D and the target value Dtar−. The integrated value ΣDex(N−1) used in the present embodiment is a value obtained by accumulating the difference between the evaluation value D and the target value Dtar+ and the difference between the evaluation value D and the target value Dtar− for the period T. In the present embodiment, the difference between the evaluation value D and the target value Dtar+ and the difference between the evaluation value D and the target value Dtar−, which have been obtained in a cycle time earlier than the present cycle time by the period T, are not used for calculation of the integrated value ΣDex(N).

Figure 14:
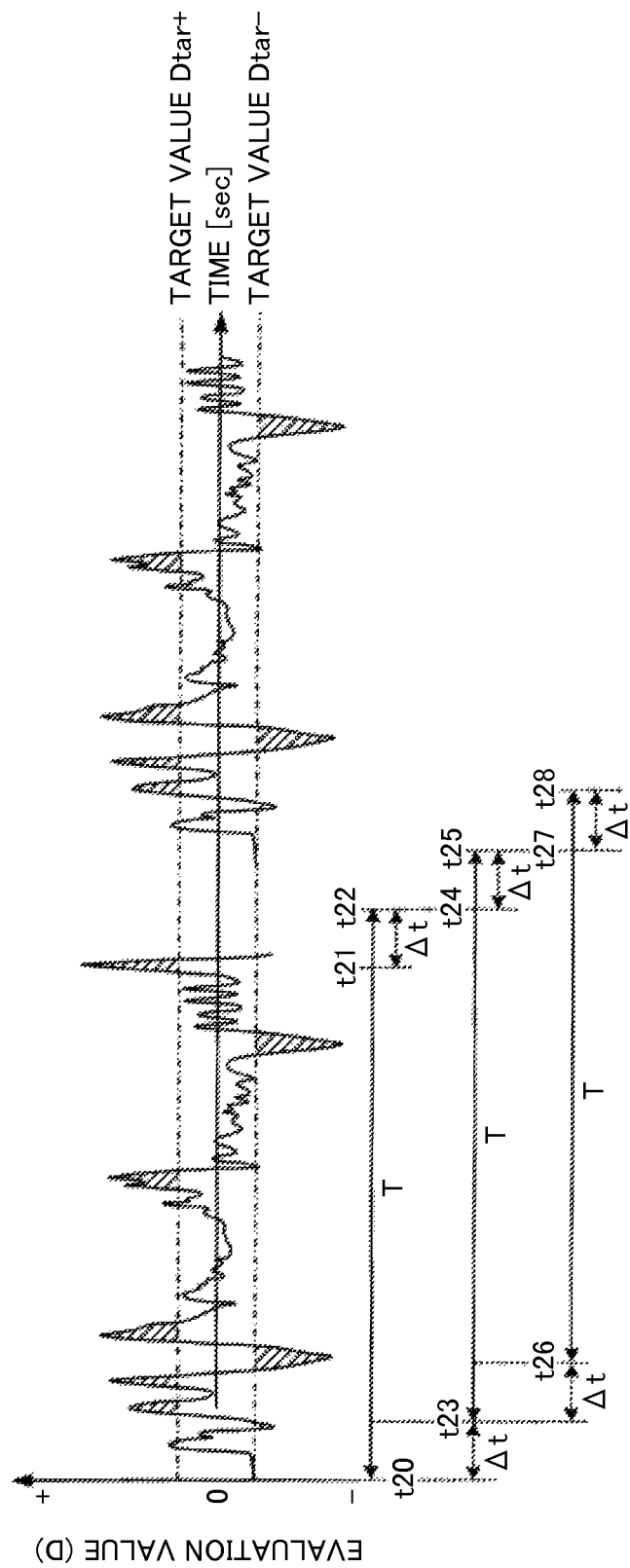
FIG. 14 is an explanatory diagram for illustrating a method of calculating the integrated value in a second embodiment.

The method of calculating the integrated value ΣDex(N) in the present embodiment is explained specifically with reference to FIG. 14. FIG. 14 shows a relationship between a change in the evaluation value D(N) (as an example) and the period T for calculating the integrated value ΣDex(N).

In FIG. 14, the integrated value ΣDex(N) is first calculated from time t20 to time t22. A period from the time t20 to the time t22 is the period T. The present cycle time is from time t21 to the time t22. The integrated value ΣDex(N−1) is calculated from the time t20 to the time t21. A method of calculating the integrated value ΣDex(N−1) is the same as the method described in the first embodiment. As expressed in the expression (7), the integrated value ΣDex(N−1) is multiplied by the correction coefficient "a."

A difference Dex(N) is calculated from the time t21 to the time t22. That is, first whether or not the evaluation value D(N) exceeds the target value Dtar+ or the target value Dtar− is determined. When the evaluation value D(N) exceeds the target value Dtar+ or the target value Dtar−, the difference Dex(N) between the evaluation value D(N) and the target value Dtar+ or the difference Dex(N) between the evaluation value D(N) and the target value Dtar− is calculated. When the integrated value ΣDex(N−1) and the difference Dex(N) are obtained, the integrated value ΣDex(N) is calculated based on the expression (7).

As expressed by the expression (7), in the present embodiment, a time average value, obtained by dividing a value of "a×ΣDex(N−1)(T−Δt)+Dex(N)Δt" by the period T, is used as the integrated value ΣDex(N). When the integrated value ΣDex(N) is larger than the threshold value K, discharge of the assembled battery 10 can be restricted, similarly to the first embodiment. The threshold value K used in the present embodiment is different from the threshold value K described in the first embodiment, and is a value that corresponds to the period T.

When the present cycle time ends at the time t22, calculation of the integrated value ΣDex(N) is performed from time t23 to time t25. The time t23 is the time at which one cycle time Δt has elapsed from the time t20. Time t24 is at the same time as the time t22. The time t25 is the time at which one cycle time Δt has elapsed from the time t24. The present cycle time is from the time t24 to the time t25.

The integrated value ΣDex(N) calculated from the time t23 to the time t25 is the time average value obtained by dividing the value of "a×ΣDex(N−1)(T−Δt)+Dex(N)Δt" by the period T. When the integrated value ΣDex(N) is larger than a threshold value, discharge of the assembled battery 10 is restricted, similarly to the first embodiment.

When the present cycle time ends at the time t25, calculation of the integrated value ΣDex(N) is performed from time t26 to time t28. The time t26 is the time at which one cycle time Δt has elapsed from the time t23. Time t27 is at the same time as the time t25. The time t28 is the time at which one cycle time Δt has elapsed from the time t27. The present cycle time is from the time t27 to the time t28.

The integrated value ΣDex(N) calculated from the time t26 to the time t28 is the time average value obtained by dividing the value of "a×ΣDex(N−1)(T−Δt)+Dex(N)Δt" by the period T. When the integrated value ΣDex(N) is larger than the threshold value, discharge of the assembled battery 10 is restricted, similarly to the first embodiment.

As described in the first embodiment, high-rate degradation is lessened by resting charge/discharge of the assembled battery 10 or by other methods. Therefore, at the time earlier than the present cycle time by the period T or longer, even when the evaluation value D exceeds the target value Dtar+ or the target value Dtar−, this evaluation value D hardly affects evaluation of high-rate deterioration. Thus, in the present embodiment, the evaluation value D obtained in the latest period T is only used to calculate the integrated value ΣDex(N).

Therefore, the integrated value ΣDex(N) can be obtained taking into account lessening of high-rate deterioration, and discharge of the assembled battery 10 can be restricted according to high-rate deterioration that has not yet been lessened. When the past evaluation value D that hardly affects evaluation of high-rate deterioration is also used to calculate the integrated value ΣDex(N), the integrated value ΣDex(N) becomes larger than the threshold value K more easily, and there is a possibility of excessively restricting discharge of the assembled battery 10. In the present embodiment, because the past evaluation value D is not used for calculation of the integrated value ΣDex(N), discharge of the assembled battery 10 can be prevented from being excessively restricted according to the integrated value ΣDex(N).

As shown in FIG. 14, because the evaluation value D varies with time, the difference between the evaluation value D and the target value Dtar+ and the difference between the evaluation value D and the target value Dtar− also vary with time. When the difference between the evaluation value D and the target value Dtar+ and the difference between the evaluation value D and the target value Dtar− vary, a value of "a×ΣDex(N−1)+Dex(N)" also varies. Thus, the value of "a×ΣDex(N−1)+Dex(N)" can sometimes increase or decrease temporarily. When the value of "a×ΣDex(N−1)+Dex(N)" and the threshold value K are compared, the value of "a×ΣDex(N−1)+Dex(N)" can sometimes be larger than the threshold value K because this value increases temporarily. In this case, discharge of the assembled battery 10 is restricted.

In the present embodiment, the time average value, obtained by dividing the value of "a×ΣDex(N−1)(T−Δt)+Dex(N)Δt" by the period T, is used as the integrated value ΣDex(N). The value of "a×ΣDex(N−1)+Dex(N)" can be dispersed for the period T by using the integrated value ΣDex(N) that is the time average value. This can prevent the value of "a×ΣDex(N−1)+Dex(N)" from temporarily increasing and becoming larger than the threshold value K, and can prevent discharge of the assembled battery 10 from being excessively restricted.

Figure 15:
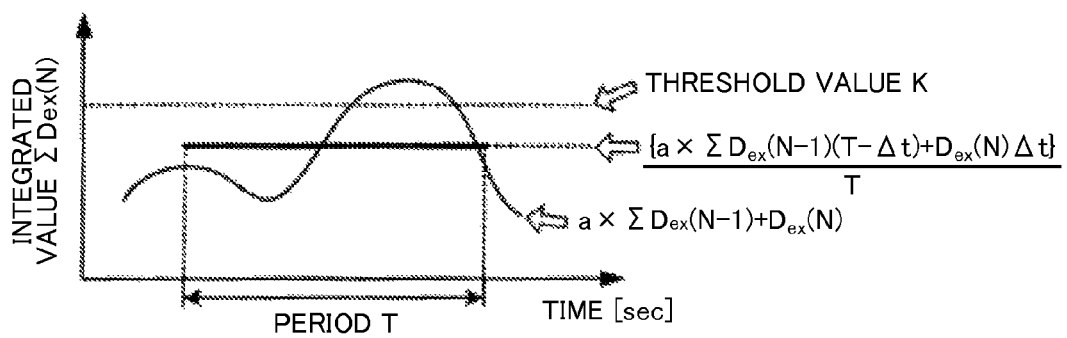
FIG. 15 shows a relationship between a time average value and the threshold value in the second embodiment.

In FIG. 15, the value of "a×ΣDex(N−1)+Dex(N)" is used as the integrated value ΣDex(N), and a change in the value of "a×ΣDex(N−1)+Dex(N)" is shown (as an example). When the value of "a×ΣDex(N−1)+Dex(N)" and the threshold value K are compared, at the point in time when the value of "a×ΣDex(N−1)+Dex(N)" becomes larger than the threshold value K, discharge of the assembled battery 10 is restricted.

In contrast, in the present embodiment, the time average value obtained by dividing the value of "a×ΣDex(N−1)(T−Δt)+Dex(N)Δt" by the period T is used as the integrated value ΣDex(N), and this time average value and the threshold value K are compared. The time average value is used, and therefore even when the value of "a×ΣDex(N−1)+Dex(N)" temporarily becomes larger than the threshold value K, the time average value sometimes does not become larger than the threshold value K. This can prevent the time average value from becoming larger than the threshold value K, and can prevent discharge of the assembled battery 10 from being excessively restricted.

In the present embodiment, as expressed by the expression (7), the integrated value ΣDex(N−1) is multiplied by the correction coefficient "a" (0<a<1). However, the integrated value ΣDex(N) may not be multiplied by the correction coefficient "a." That is, the difference between the evaluation value D and the target value Dtar+ and the difference between the evaluation value D and the target value Dtar− are accumulated in the latest period T, and the time average value, obtained by dividing the accumulated value by the period T, can be used as the integrated value ΣDex(N).

In the first embodiment, the integrated value ΣDex(N) is calculated based on the expression (5). This calculation takes into account all the past evaluation values D. As described in the present embodiment, the integrated value ΣDex(N) can be calculated only taking into account the evaluation value D obtained in the latest period T. That is, the value of "a×ΣDex(N−1)+Dex(N)" described in the present embodiment can be used as the integrated value ΣDex(N).

The invention claimed is:

1. A control device configured to control discharge of a nonaqueous secondary battery so that discharge electric power of the nonaqueous secondary battery does not exceed an upper limit value, the control device comprising:
    a current sensor configured to detect a current value at a time of charging and discharging the nonaqueous secondary battery; and
    a controller configured to calculate evaluation values for evaluating a first deterioration component based on a discharge state detected by using the current sensor, and to reduce the upper limit value when a value, obtained by integrating exceeding values of the evaluation values, exceeds a threshold value, the first deterioration component reducing output performance of the nonaqueous secondary battery due to an imbalance of ion concentrations in an electrolyte caused by discharging the nonaqueous secondary battery, the exceeding values of the evaluation values exceeding a target value, wherein
    the controller is configured to determine whether or not a second integrated value exceeds the threshold value, the second integrated value being obtained by integrating a present evaluation value of the evaluation values and a value obtained by reducing a first integrated value with a correction coefficient, the first integrated value obtained by integrating past evaluation values of the evaluation values,
    the present evaluation value is a value exceeding the target value at present, and
    the past evaluation values are values exceeding the target value in past.

2. The control device according to claim 1, wherein
the correction coefficient is a value larger than 0 and smaller than 1, and
the controller is configured to integrate the present evaluation value and a value obtained by multiplying the first integrated value by the correction coefficient to calculate the second integrated value.

3. The control device according to claim 1, wherein
the controller is configured to calculate the second integrated value for a predetermined period that is a latest period.

4. The control device according to claim 3, wherein
the controller is configured to calculate a time average value by dividing the second integrated value, calculated for the predetermined period that is the latest period, by the predetermined period to determine whether or not the time average value exceeds the threshold value.

5. The control device according to claim 1, wherein
when the target value is a positive target value and each of values of the exceeding values is larger than the positive target value, the controller is configured to add a difference between the positive target value and the each of values of the exceeding values to calculate the first integrated value and the second integrated value, and
when the target value is a negative target value and each of values of the exceeding values is smaller than the negative target value, the controller is configured to subtract a difference between the negative target value and the each of values of the exceeding values to calculate the first integrated value and the second integrated value.

6. The control device according to claim 1, wherein
the controller is configured to change the threshold value so that as a second deterioration component that represents deterioration of a constituent material that contributes to charge and discharge of the nonaqueous secondary battery is larger, an amount of increasing the second integrated value until the second integrated value reaches the threshold value is smaller, and
the controller is configured to change the threshold value so that as the second deterioration component is smaller, an amount of increasing the second integrated value until the second integrated value reaches the threshold value is larger.

7. The control device according to claim 6, wherein
the controller includes a memory that stores therein a plurality of maps for identifying the threshold value according to the second deterioration component,
the controller is configured to estimate the second deterioration component using a temperature and an energization amount of the nonaqueous secondary battery, and
the controller is configured to identify the threshold value using a map that corresponds to the second deterioration component that has been estimated among the plurality of the maps stored in the memory.

8. The control device according to claim 1, wherein
the nonaqueous secondary battery is configured to output energy to be used for a vehicle to run.

9. A control method comprising:
controlling discharge of a nonaqueous secondary battery so that discharge electric power of the nonaqueous secondary battery does not exceed an upper limit value;
detecting a current value at a time of charging and discharging the nonaqueous secondary battery by using a current sensor;
calculating evaluation values for evaluating a first deterioration component based on a discharge state detected by using the current sensor, the first deterioration component reducing output performance of the nonaqueous secondary battery due to an imbalance of ion concentrations in an electrolyte caused by discharging the nonaqueous secondary battery;
determining whether or not a second integrated value exceeds a threshold value, the second integrated value being obtained by integrating a present evaluation value of the evaluation values and a value, obtained by reducing a first integrated value with a correction coefficient, which exceeds a target value, the first integrated value obtained by integrating past evaluation values of the evaluation values; and reducing the upper limit value when the second integrated value exceeds the threshold value, wherein the present evaluation value is a value exceeding the target value at present, and the past evaluation values are values exceeding the target value in past.

10. The control method according to claim 9, further comprising integrating the present evaluation value and a value obtained by multiplying the first integrated value by the correction coefficient to calculate the second integrated value, wherein the correction coefficient is a value larger than 0 and smaller than 1.

11. The control method according to claim 9, further comprising calculating the second integrated value for a predetermined period that is a latest period.

12. The control method according to claim 11, further comprising calculating a time average value by dividing the second integrated value, calculated for the predetermined period that is the latest period, by the predetermined period;

determining whether or not the time average value exceeds the threshold value; and reducing the upper limit value when the time average value exceeds the threshold value.

* * * * *